US006653563B2

(12) United States Patent
Bohr

(10) Patent No.: US 6,653,563 B2
(45) Date of Patent: Nov. 25, 2003

(54) ALTERNATE BUMP METALLURGY BARS FOR POWER AND GROUND ROUTING

(75) Inventor: Mark T. Bohr, Oloha, OR (US)

(73) Assignee: Intel Corporation, Santa Clara, CA (US)

( * ) Notice: Subject to any disclaimer, the term of this patent is extended or adjusted under 35 U.S.C. 154(b) by 245 days.

(21) Appl. No.: 09/823,427

(22) Filed: Mar. 30, 2001

(65) Prior Publication Data

US 2002/0141171 A1 Oct. 3, 2002

(51) Int. Cl.[7] .................................................. H05K 5/00
(52) U.S. Cl. ...................... 174/52.1; 361/760; 361/764; 257/670; 257/737; 257/738
(58) Field of Search ................................ 174/52.1, 52.2, 174/52.3; 361/751, 760, 764; 257/670, 673, 666, 691, 737, 738, 773, 780, 787

(56) References Cited

U.S. PATENT DOCUMENTS

| | | | |
|---|---|---|---|
| 4,710,798 A | | 12/1987 | Marcantonio |
| 5,083,187 A | | 1/1992 | Lamson et al. |
| 5,336,992 A | * | 8/1994 | Saito et al. .................. 324/754 |
| 5,886,409 A | * | 3/1999 | Ishino et al. ................. 257/737 |
| 5,943,597 A | * | 8/1999 | Kleffner et al. ............. 438/613 |
| 6,057,596 A | | 5/2000 | Lin et al. |
| 6,171,888 B1 | * | 1/2001 | Lynch et al. ................. 438/123 |
| 6,307,256 B1 | * | 10/2001 | Chiang et al. ............... 257/668 |

FOREIGN PATENT DOCUMENTS

| | | |
|---|---|---|
| EP | 0 361 825 A2 | 4/1990 |
| JP | 01-015737 | 8/1990 |
| JP | 10-301301 | 5/2000 |
| JP | 10-364236 | 7/2000 |
| JP | 11-111074 | 11/2000 |

OTHER PUBLICATIONS

PCT Search Report, International Application No.: PCT/US 02/08905, Apr. 10, 2003.

* cited by examiner

*Primary Examiner*—Dean A. Reichard
*Assistant Examiner*—W. David Walkenhorst
(74) *Attorney, Agent, or Firm*—Blakely, Sokoloff, Taylor & Zafman LLP

(57) ABSTRACT

An apparatus, including a die having a surface, further including an array of electrically conductive bumps; and a plurality of electrically conductive bars positioned within the array of electrically conductive bumps.

5 Claims, 8 Drawing Sheets

C4 BUMP PATTERN

I/O SIGNAL, GROUND AND POWER BUMPS

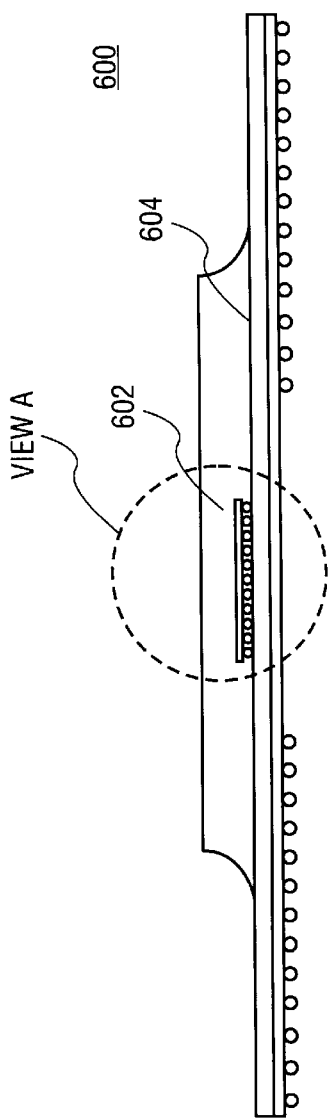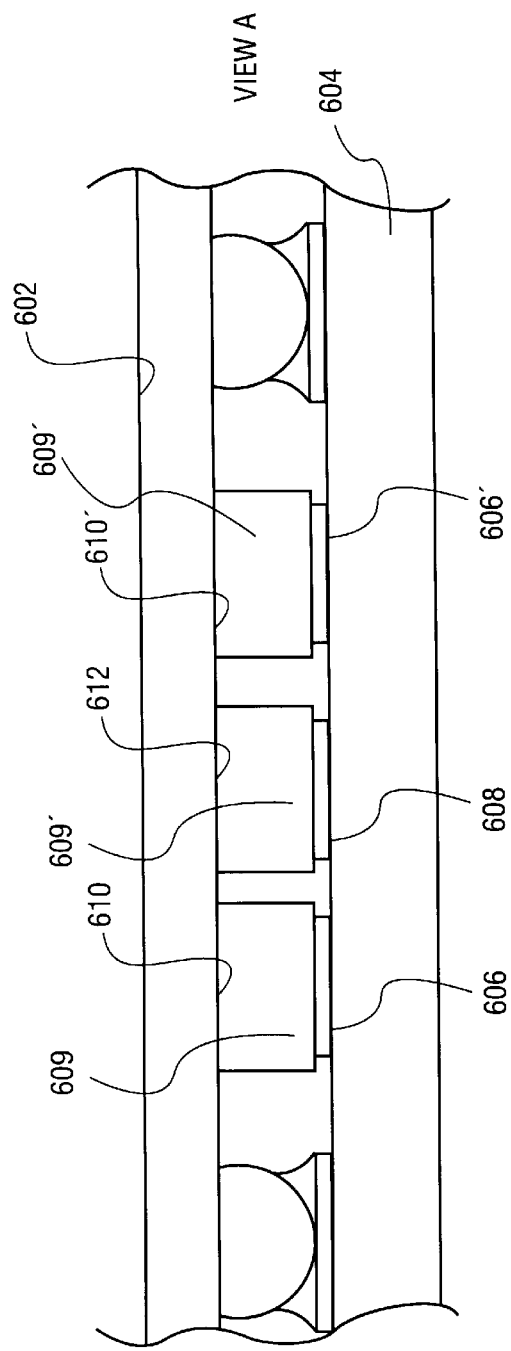

ALTERNATE BUMP METALLURGY BARS FOR POWER AND GROUND ROUTING

BACKGROUND OF THE INVENTION

1. Field of the Invention

This invention relates to the field of microchip packaging and in particular to routing power and ground connections between the microchip and the package substrate.

2. Discussion of Related Art

Integrated circuits that use high power levels, need a dense pattern of power and ground lines to deliver the required current and achieve expected performance. As the power requirements for a circuit increase, more of the normal interconnect layers (e.g. M5 and M6 on P860) are needed for routing power and ground and they are less available for routing signals. The need for routing power and ground must be addressed by adding more interconnect layers. FIG. 1A is an illustration of a die surface with a C4 bump pattern containing I/O for signal, power, and ground. Challenges to provide finer pitch bumps between a die and a die package have increased routing and routing complexity at the die surface. FIG. 1B is an illustration of a die surface with ABM bumps connected to ground (Vss) and power (Vdd) lines on the chip. With this design, minimum spacing between bumps is approximately 75 microns, bump diameters approximately 75 microns, with a minimum pitch of 150 microns to efficiently route signal lines.

SUMMARY OF THE INVENTION

An apparatus, comprising: a die having a surface, comprising: an array of electrically conductive bumps; and a plurality of electrically conductive bars positioned within the array of electrically conductive bumps.

BRIEF DESCRIPTION OF THE DRAWINGS

FIG. 5A is an illustration of the die containing power and ground lines within a metal layer.

FIG. 5B is an illustration of the die have a dielectric layer deposited over the metal layer.

FIG. 5C is an illustration of the die having a passivation layer deposited over the dielectric layer.

FIG. 5D is an illustration of the die having passivation openings etched through the dielectric layer and the passivation layer.

FIG. 5E is an illustration of the die having lined passivation openings.

FIG. 5F is an illustration of the die having a patterned photoresist layer.

FIG. 5G is an illustration of the die having the patterns filled in with copper.

FIG. 5H is an illustration of the die with power bars, ground bars, and a bump having alternate bump metallurgy.

FIGS. 6A and 6B illustrate a die-substrate assembly 600.

DETAILED DESCRIPTION OF THE PRESENT INVENTION

A structure and method for providing power and ground bars, centered within an array of I/O signal bumps on a die surface is disclosed. In an embodiment, the I/O signal bumps and the power and ground bars could be in the form of copper bumps. The structure and method can provide an efficient means of connecting power and ground between a microchip (die) and a substrate. The structure and method can make use of a bump metallurgy that is different from solder (i.e. alternate bump metallurgy or ABM). As a result, the power and ground structures can be located on the die with the I/O signal bumps (signal bumps), positioned in an ordered array, surrounding the power and ground structures.

A structure and method for providing power and ground bars, centered within an array of I/O signal bumps on a die surface is disclosed. In an embodiment, the I/O signal bumps and the power and ground bars could be in the form of copper bumps. The structure and method can provide an efficient means of connecting power and ground between a microchip (die) and a substrate. The structure and method can make use of a bump metallurgy that is different from solder (i.e. alternate bump metallurgy or ABM). As a result, the power and ground structures can be located on the die with the I/O signal bumps (signal bumps), positioned in an ordered array, surrounding. As a further result, the power and ground structures can be fabricated from the same metal layer as the signal bumps. This structure and method allows for the placement of more power and ground lines within the interconnect metal layers since tighter spacing can be used.

In an embodiment, at assembly, the signal bumps on the die can mate with respective solder lands on a substrate such as a die package. The die package can have a number of solder lands to be in contact with the power and ground bars on the die as well as the signal bumps. Alternatively, the solder lands can cover a large enough area to contact the entire surface of one or more of the power bars and/or ground bars. The power bars and ground bars, and the mating solder lands, may take on any shape from square to a number of linear strips.

In the following description numerous specific details are set forth such as specific materials, equipment, and processes in order to provide a thorough understanding of the present invention. In other instances, well known computer assembly techniques and machinery have not been set forth in detail in order to minimize obscuring the present invention.

Figure 2B:
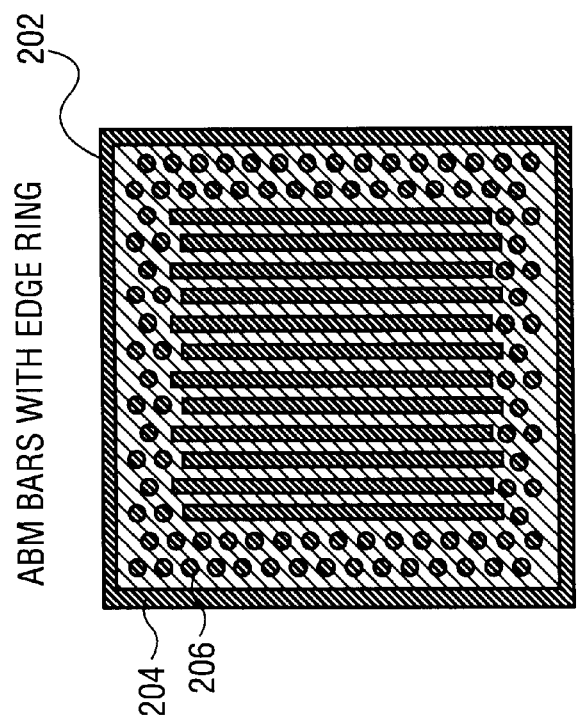
FIG. 2B is an illustration of the die with power and ground bars and an edge ring.
Figure 2A:
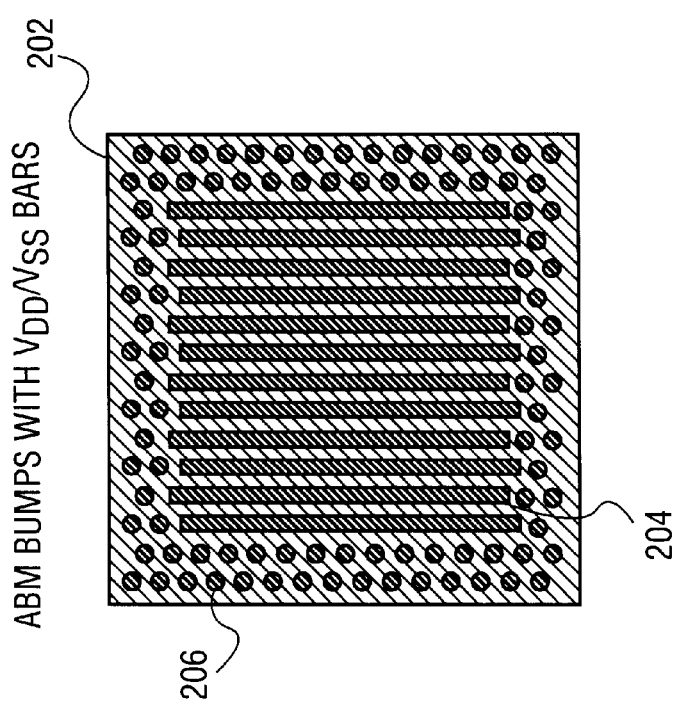
FIG. 2A is an illustration of the die with power and ground bars using alternate bump metallurgy.

FIGS. 2A & 2B are illustrations of the die 202 with power and ground bars 204 using alternate bump metallurgy (ABM). In an embodiment as shown in FIG. 2A, the signal bumps 206 are placed in an arrayed pattern having the power and ground bars 204 positioned within. In an alternate embodiment, FIG. 2B, an additional series of bars are placed at the periphery of the signal bumps, i.e. the edge of the wafer. The purpose of the edge bars is to provide an improved seal when the die is attached to a substrate such as plastic packaging. In an embodiment, the power and ground bars 204 can be formed in the shape of rectangles and separated from the top metal by a dielectric and a passivation coating. The power and ground bars can be subsequently coated with a thin layer of a low temperature solder to improve their electrical contact with the mating solder lands or bars on the mating substrate.

Figure 3:
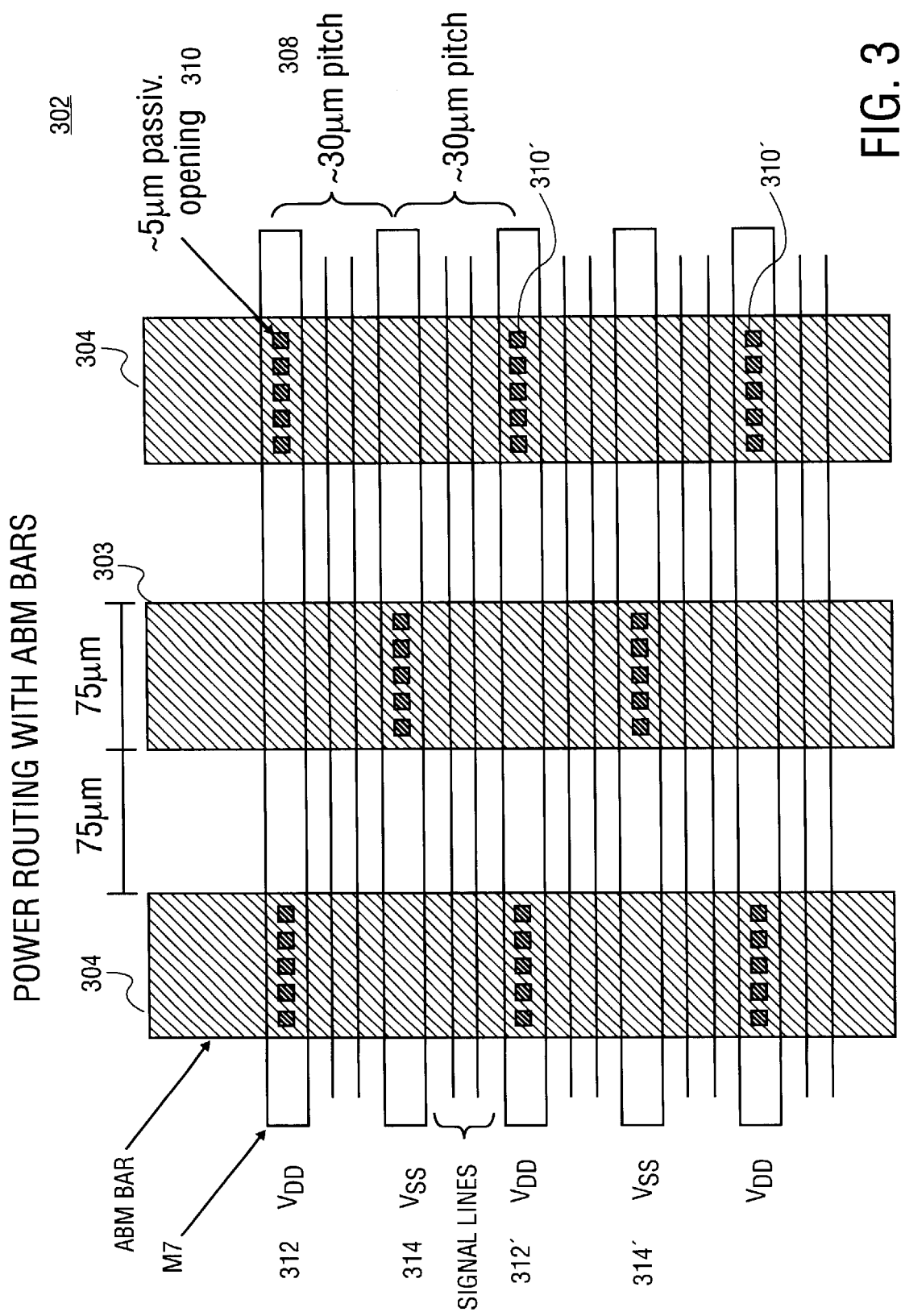
FIG. 3 is an illustration of ABM bars placed over ground and power lines existing within a metal layer and interconnected with lines passivation openings.

FIG. 3 is an illustration of an area of the die 302 having power 304 and 304' and ground 303 ABM bars placed over ground 314 and 314' and power 312 and 312' lines existing within a metal layer of the die 302 and electrically interconnected with lined passivation openings (in the passivation and dielectric layers) 310 and 310'. The ABM bars 304, 304' and 303 may be approximately 75 microns wide and spaced approximately 75 microns apart on the die 302. The lined passivation openings 310 and 310' may be formed by an area that is approximately square with each side approximately 5 microns in length. A sufficient number of lined passivation openings 310 and 310' between the ABM bars 304, 304' and 303 and the metal surface can be formed to interconnect the ABM bars 304, 304' and 303 to the respective power 312 and 312' and ground 314 and 314' lines.

FIG. 3 is an illustration of an area of the die 302 having power 304 and 304' and ground 303 ABM bars placed over ground 312 and 312' and power 314 and 314' lines existing within a metal layer of the die 302 and electrically interconnected with lined passivation openings (in the passivation and dielectric layers) 310 and 310'. The ABM bars 304, 304' and 303 may be approximately 75 microns wide and spaced approximately 75 microns apart on die 302. The lined passivation openings 310 and 310 ' may be formed by an area that is approximately square with each side approximately 5 microns in length. A sufficient number of lined passivation openings 310 and 310' between the ABM bars 304, 304' and 303 and the metal surface can be formed to interconnect the ABM bars 304, 304' and 303 to the respective power 314 and 314' and ground 312 and 312' lines.

Figure 1A:
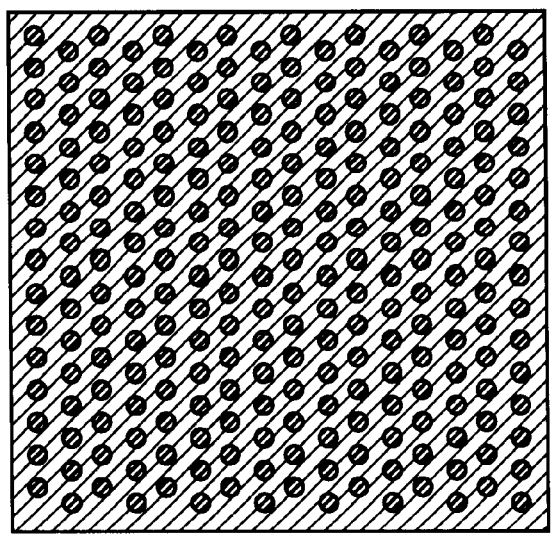
FIG. 1A is an illustration of a die surface with a C4 bump pattern containing I/O for signal, power, and ground.
Figure 1B:
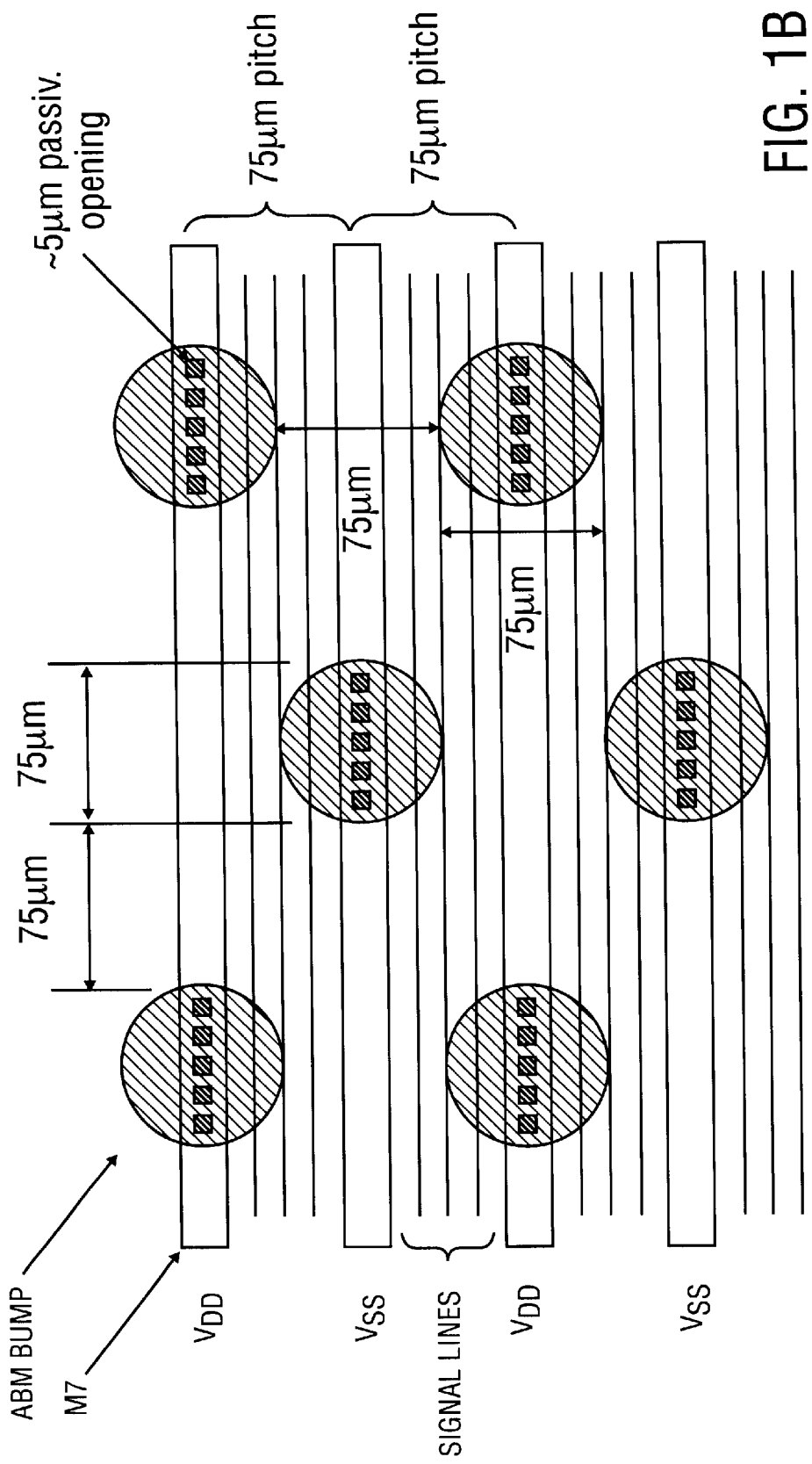
FIG. 1B is an illustration of a die surface with ABM bumps connected to ground (Vss) and power (Vdd) lines on the die.

FIG. 3 further illustrates the finer pitch 308 available (bars) 304 and 304' than is available when using bumps (FIG. 1C above) to connect power and ground to circuitry outside the die 302. The ABM bars 304 and 304' are better for power routing because they can more uniformly distribute power across the die 302. For ABM bumps (FIG. 1B above), the underlying power lines in the last metal layer can only occur under a bump, and bump pitch is limited to approximately 150 um due to process constraints. The power and ground lines can only be spaced every 75 microns. Returning to FIG. 3, with ABM bars 304 and 304', passivation openings 310 can occur anywhere along the bar 304 and 304', therefore power and ground lines (Vdd/Vss) 312, 312', 314, and 314' can be placed almost as often as desired, such as every 30 microns. Having more power and ground lines 312, 312', 314, and 314' that are spaced more closely together improves power delivery by reducing resistive drop and having lower inductance. The result is improved performance.

Figure 4B:
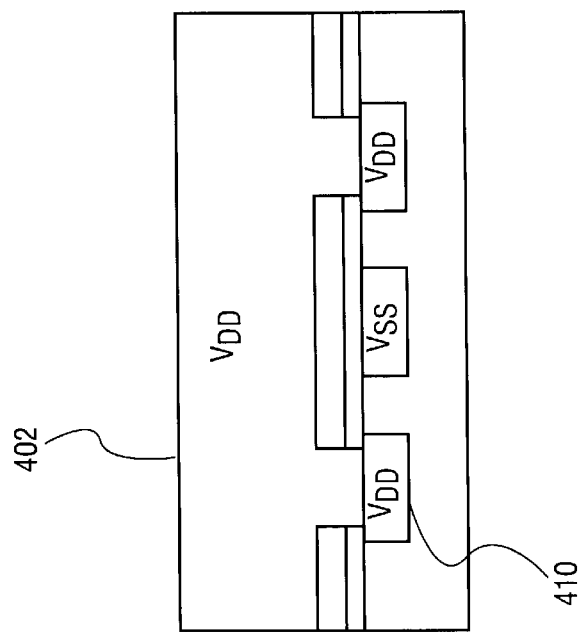
FIG. 4B is an illustration of the ABM bar connected to the M7 copper layer in a view rotated 90 degrees from that of FIG. 4A.
Figure 4A:
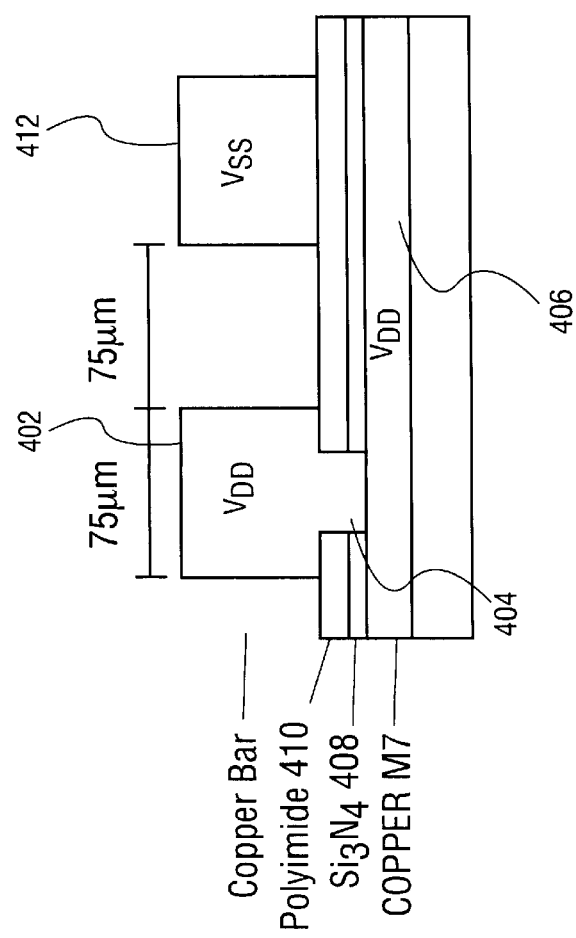
FIG. 4A is an illustration of the ABM bar connected to the M7 copper layer.

FIGS. 4A & 4B illustrate side views of ABM ground bars 402 having interconnections (lined passivation openings) 404 to the M7 layer 406. In an embodiment, the interconnects pass through an $Si_3N_4$ dielectric layer 408 and a polyimide passivation layer 410. FIGS. 4A & 4B show the ABM ground bar 402 connecting to a copper ground line 410 fabricated from the M7 406 layer while an adjacent ABM power bar 412 is separated from the ground line 410 by the $Si_3N_4$ 408 and polyimide 410 layers.

Figure 5A:
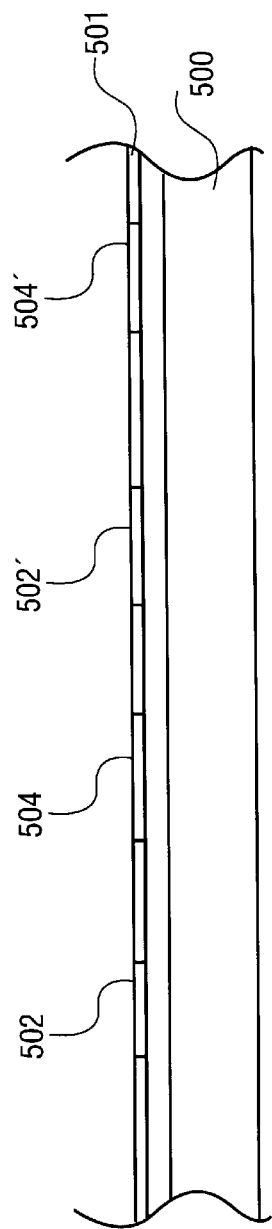
FIGS. 5A–5H are illustrations of a method to produce ABM bars on the die.
Figure 5B:
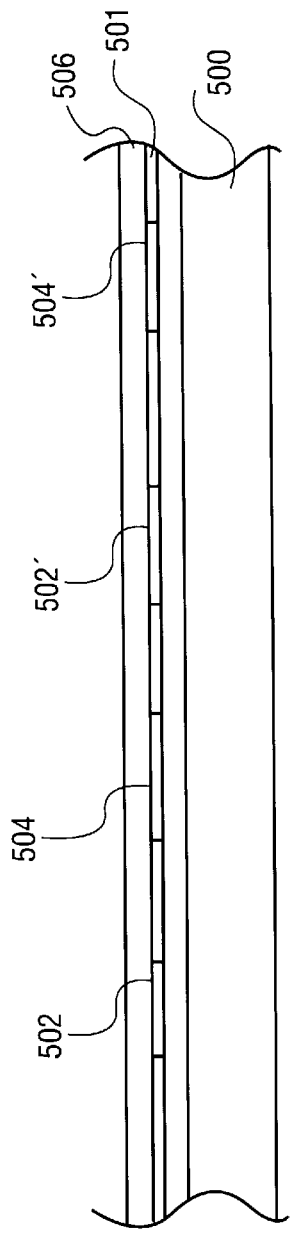
Figure 5C:
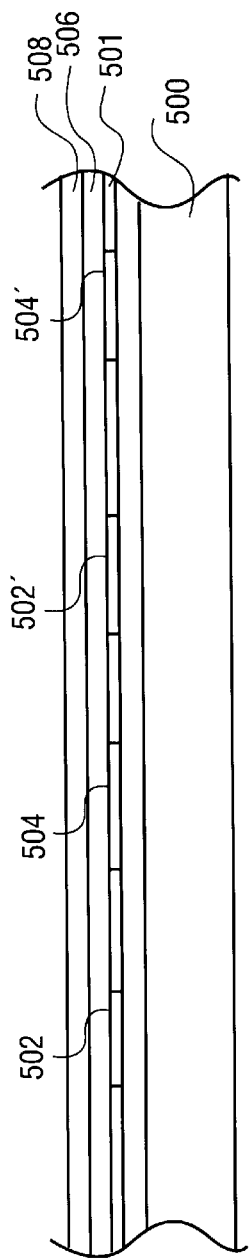
Figure 5D:
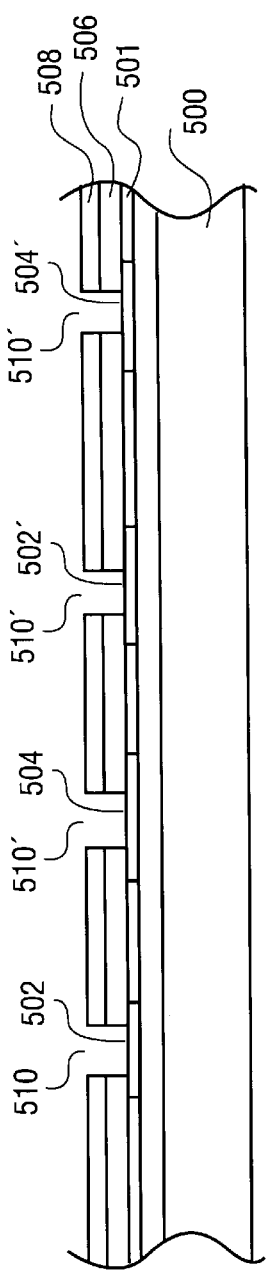
Figure 5E:
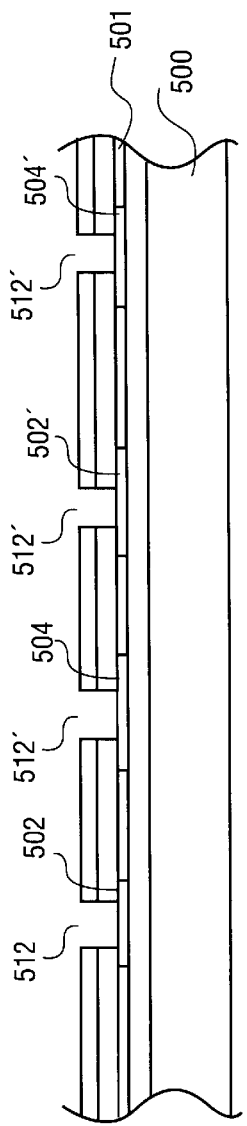
Figure 5F:
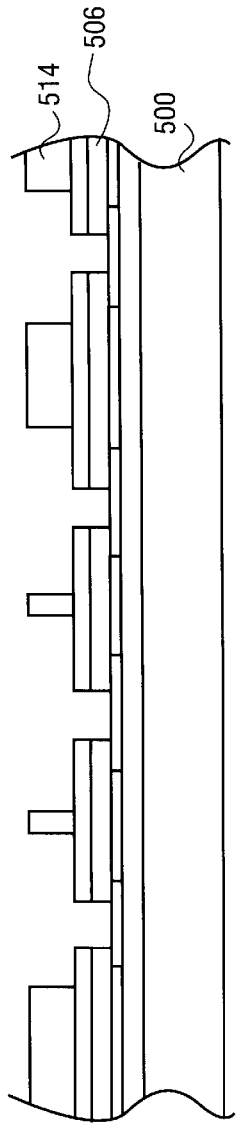
Figure 5G:
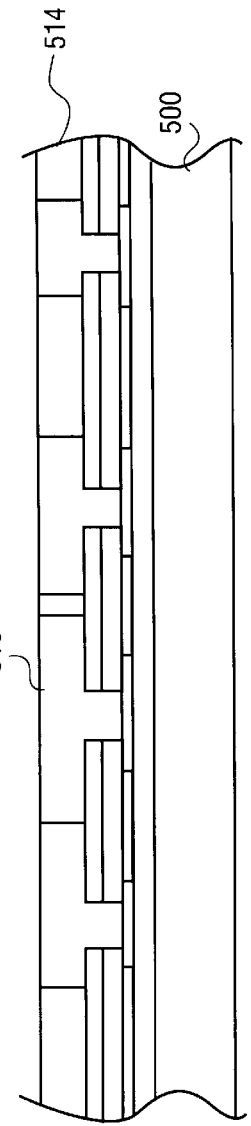
Figure 5H:
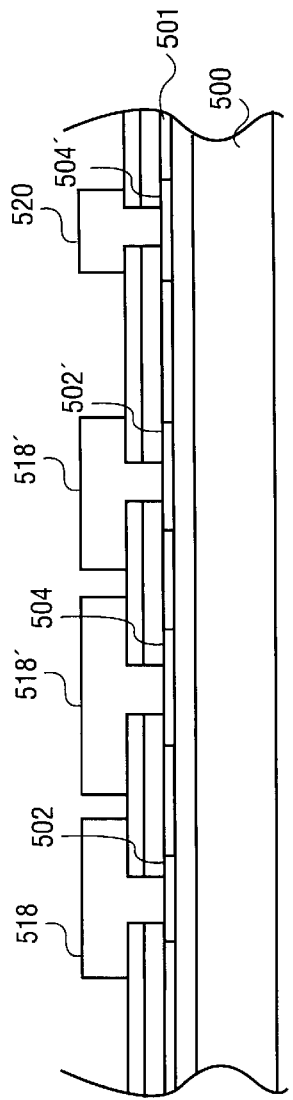

FIGS. 5A–5H illustrate a method for producing the ABM bars on the die. FIG. 5A illustrates a final metal interconnect layer 501 such as M7 (deposited within a patterned dielectric layer) on a die 500 which can include a combination of power lines 502 and 502' and ground lines 504 and 504'. As shown in FIG. 5B, a layer of a dielectric material 506 such as silicon nitride ($Si_3N_4$) or silicon carbide SiC is deposited over the surface of the die 500 that includes the etched M7 layer 501. FIG. 5C illustrates the deposit of a passivation layer 508. In an embodiment, the passivation layer may be a material such as a polyimide or silicon dioxide and is blanket deposited by sputtering, spinning, CVD, or rolling to cover the dielectric coating 506. After application of the passivation layer, the surface can be patterned with a photoresist (not shown). FIG. 5D illustrates passivation openings 510 and 510' in the passivation layer 508 and the dielectric 506 layer, exposing areas of the metal power 502 and 502', ground lines 504 and 504' within M7 501. The openings 510 and 510' may be created by first patterning with a photoresist (not shown) and then etching through the passivation 506 and dielectric 504 layers to expose lines 502, 502', 504, and 504' at M7 501. FIG. 5E is an illustration of lined passivation openings 512 and 512' which are lined with a conductive metal or metal alloy. In an embodiment, the passivation openings 512 and 512' have a dual layer (not shown) sputter lined with titanium and then copper. FIG. 5F illustrates a patterned photoresist 514 applied over the passivation coating 506. FIG. 5G illustrates the results of an electroplating process to fill-in openings in the photoresist pattern 514 with copper 516. FIG. 5H illustrates a cross-section of the die 500 where the photoresist has been striped away with a solvent and number of ABM bars 518 and 518' along with a copper signal bump 520 remain that are interconnected to lines 502, 502', 504, and 504' within M7 501.

FIGS. 6A & 6B illustrate a die-substrate assembly 600. An assembly process, such as an embodiment described in FIGS. 5A–5H above, can attach the die 602 to the substrate 604. The substrate 604 can be any mating component to connect the die 602 to outside circuitry, such as a package or printed circuit board where the substrate 604 can contain contacting ground 606 and 606' and power 608 areas of solder 609 and 609' to mate with the ground 610 and 610' and power 612 bar areas on the die 602. The solder 609 and 609' may be the low temperature solder such as lead tin or silver tin, that is coated over surfaces of copper beneath (not shown). A benefit of having equivalent mating solder areas 609 and 609' on the substrate 604 to mate with the copper power 610, and 610' and ground 612 bars on the die 602, is that a rate of heat transfer from the die 602, while the die is performing operations in a computer, can be increased.

A heating cycle is then performed by placing the die-substrate assembly in a reflow oven that heats the solder until it flows as a liquid. After the reflow operation, the copper bumps are electrically and mechanically connected to the solder lands and the power/ground bars of the die are electrically and mechanically connected to the mating power/ground strips or lands on the substrate.

During production, a substrate such as plastic packaging or a printed circuit board, that later mates with the die, may be passed through a soldering apparatus where one side is subjected to a soldering operation to solder hundreds of terminals on each of the substrates. The use of wave soldering machines for this purpose is well known. These machines include conveyors that carry the boards over a molten bath of solder that is agitated to rise in waves against the undersides of the boards. Prior to wave soldering, a solder masking operation is required to protect portions of the package substrate from being contacted by the hot molten solder. The solder mask is applied as one or more coatings through well-known techniques such as sputter, spray, or silk-screen such as through a steel screen mesh. When the solder mask is applied with a screen mesh, a pattern in the mesh can provide openings in the solder mask to be later filled with the solder operation. After cure of the solder masking, wave soldering is performed to fill-in the areas open in the mask. The cured solder mask remains on the finished substrate providing good dielectric coverage for the circuit lines to be protected.

We claim:

1. A method, comprising:

depositing a dielectric layer over a top metal layer of a die having one or more power lines and one or more ground lines formed thereon;

depositing a passivation layer upon the dielectric layer;

creating one or more passivation openings in the dielectric layer and the passivation layer such that a portion of at least one of the power lines and ground lines is exposed;

lining the passivation openings with a conductive material; and depositing a plurality of electrically conductive bars on the top surface of the passivation layer that are in contact with the lined passivation openings.

2. The method of claim 1 further comprising:

placing an array of solder lands on a substrate; and connecting the die to the substrate such that the array of solder lands mate with the plurality of electrically conductive bars on the die.

3. The method of claim 2 wherein at least one of the electrically conductive bars connects to power.

4. The method of claim 2 wherein at least one of the electrically conductive bars connects to ground.

5. The method of claim 2 wherein the plurality of the electrically conductive bars forms a periphery around the die.

* * * * *

UNITED STATES PATENT AND TRADEMARK OFFICE
CERTIFICATE OF CORRECTION

PATENT NO.    : 6,653,563 B2
DATED         : November 25, 2003
INVENTOR(S)   : Bohr Page 1 of 1

It is certified that error appears in the above-identified patent and that said Letters Patent is hereby corrected as shown below:

Column 3,
Line 39, before "(bars)", insert -- when using ABM bars --.

Signed and Sealed this

Sixteenth Day of March, 2004

JON W. DUDAS
*Acting Director of the United States Patent and Trademark Office*